(12) United States Patent
Cascella

(10) Patent No.: US 6,844,752 B1
(45) Date of Patent: Jan. 18, 2005

(54) THERMAL CONDITIONING FOR INTEGRATED CIRCUIT TESTING

(75) Inventor: Anthony J. Cascella, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/666,661

(22) Filed: Sep. 19, 2003

(51) Int. Cl.[7] .............................................. G01R 31/26
(52) U.S. Cl. ....................................... 324/765; 324/760
(58) Field of Search .............................. 324/73.1, 760, 324/765, 767, 158.1; 165/201, 253; 700/153, 205; 702/99, 130

(56) References Cited

U.S. PATENT DOCUMENTS 5,498,971 A * 3/1996 Turnbull et al. ............ 324/760
6,545,494 B1 * 4/2003 Olsen et al. ................ 324/760
6,552,561 B2 * 4/2003 Olsen et al. ................ 324/760

* cited by examiner

Primary Examiner—Minh N. Tang
(74) Attorney, Agent, or Firm—W. Eric Webostad; Justin Liu

(57) ABSTRACT

Method and apparatus for thermally conditioning a microchip is described. The microchip (104) is thermally conditioned responsive to a temperature target over an interval of time. A diode voltage of a diode (503) of the microchip (104) is measured from which diode temperature is determined. The diode temperature is compared with the temperature target to determine a temperature error. This thermal conditioning may be repeated, where interval times are adjustable responsive to temperature error, until a stabilization band (401) is reached. Because a diode (503) of the microchip (104) is used, junction temperature, as opposed to external surface temperature of the microchip package, is obtained. Accordingly, a thermocouple attached to the external surface of the microchip is not needed.

26 Claims, 4 Drawing Sheets

THERMAL CONDITIONING FOR INTEGRATED CIRCUIT TESTING

FIELD OF THE INVENTION

One or more aspects of the invention relate generally to thermal conditioning for testing of integrated circuits.

BACKGROUND OF THE INVENTION

Conventionally, automated test equipment ("ATE") is coupled to a temperature forcing unit. A thermocouple is attached to an outer surface of encapsulation material used to package an integrated circuit die to form the microchip, and is attached to the temperature forcing unit. A technician then manually adjusts temperature of the temperature forcing unit. The temperature forcing unit may be set to force air at any temperature within a range of temperatures. A target temperature is known as the "set point." The amount of time allotted to allow the microchip to reach thermal stability is known as the "soak time." Once set point and soak time are set, airflow is flowed from a temperature forcing unit over the microchip. The thermocouple attached to the microchip is used to provide temperature feedback information to temperature forcing unit. Conventionally, several adjustments of the temperature forcing unit are made in order to obtain a target temperature for purposes of testing the microchip under thermal stress. Additionally, the type of thermocouple may be specified as part of the setup procedure.

Accordingly, this type of thermal conditioning provides a temperature of the material encapsulating the microchip, which given sufficient time is assumed to conduct throughout the microchip. However, when thermally stressing an integrated circuit, it would be desirable to know the temperature at the p-n junctions of the semiconductor material used to form the die ("junction temperature"), and not just the temperature of the encapsulation material. In other words, it would be more precise to know the temperature of the die itself. This would provide a more precise thermal understanding of thermal budget. Furthermore, it would be desirable if the amount of technician intervention could be reduced in order to further automate the process.

SUMMARY OF THE INVENTION

An aspect of the invention is thermally conditioning a microchip. A temperature target is set. The microchip is thermally conditioned responsive to the temperature target over an interval of time. A diode voltage of a diode of the microchip is measured. A diode temperature is determined responsive to the diode voltage measured, and the diode temperature is compared with the temperature target to determine a temperature error. This thermal conditioning may be repeated, where interval times are adjustable responsive to temperature error, until a stabilization band is reached.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

To facilitate understanding, identical reference numerals have been used, where possible, to designate identical elements that are common to the figures.

DETAILED DESCRIPTION OF THE DRAWINGS

Figure 1:
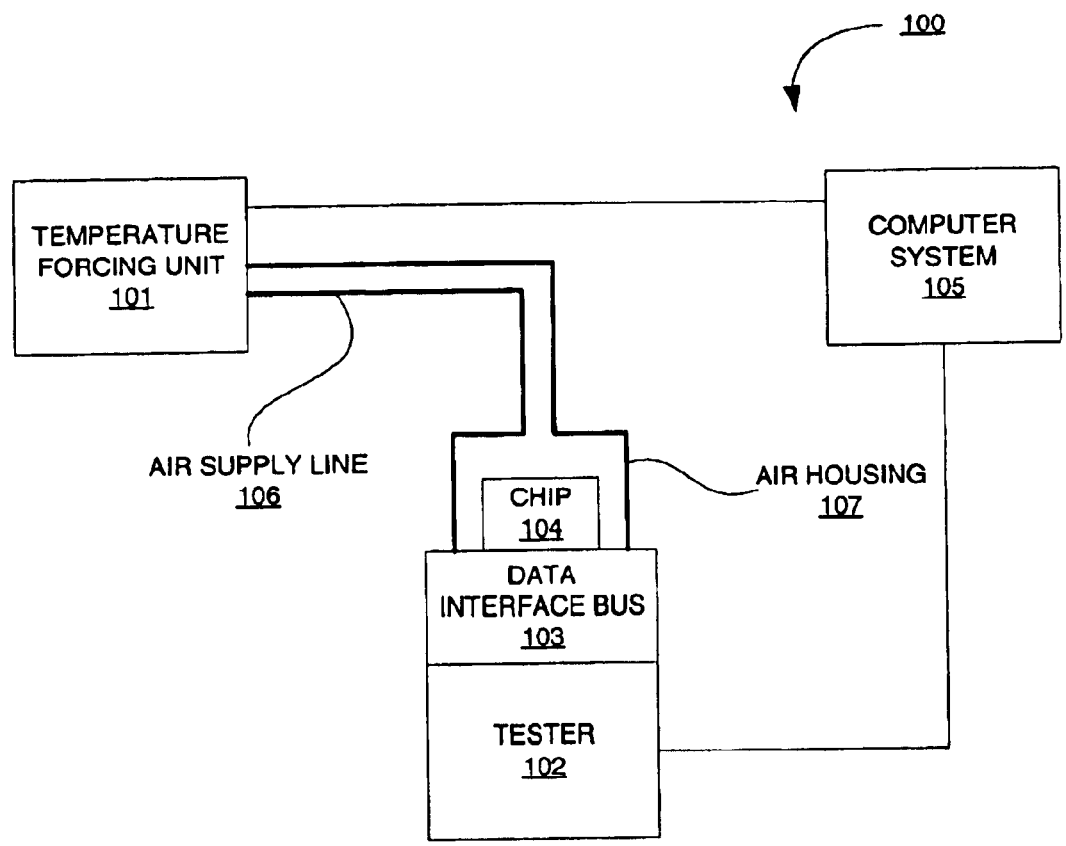
FIG. 1 is a high-level block diagram of an exemplary embodiment of a test system having a microchip under test.

FIG. 1 is a high-level block diagram of an exemplary embodiment of a test system 100 having a microchip 104 under test. Test system 100 includes a programmed computer 105, temperature forcing unit 101, tester 102 and an integrated circuit test card/data interface bus 103. Notably, a thermocouple, which conventionally would be attached to microchip 104 in a thermal test system, is not needed in test system 100. One end of air supply line 106 is connected to temperature forcing unit 101 and is used as a conduit for a temperature controlled airflow to microchip 104. The other end of air supply line 106 is connected to air housing 107 (sometimes referred to as a "sealing cup") to distribute temperature controlled air over microchip 104. Temperature forcing unit 101 and tester 102 are coupled for communication with computer system 105. Microchip 104 is coupled via data interface bus 103 with tester 102 for communication.

Figure 2:
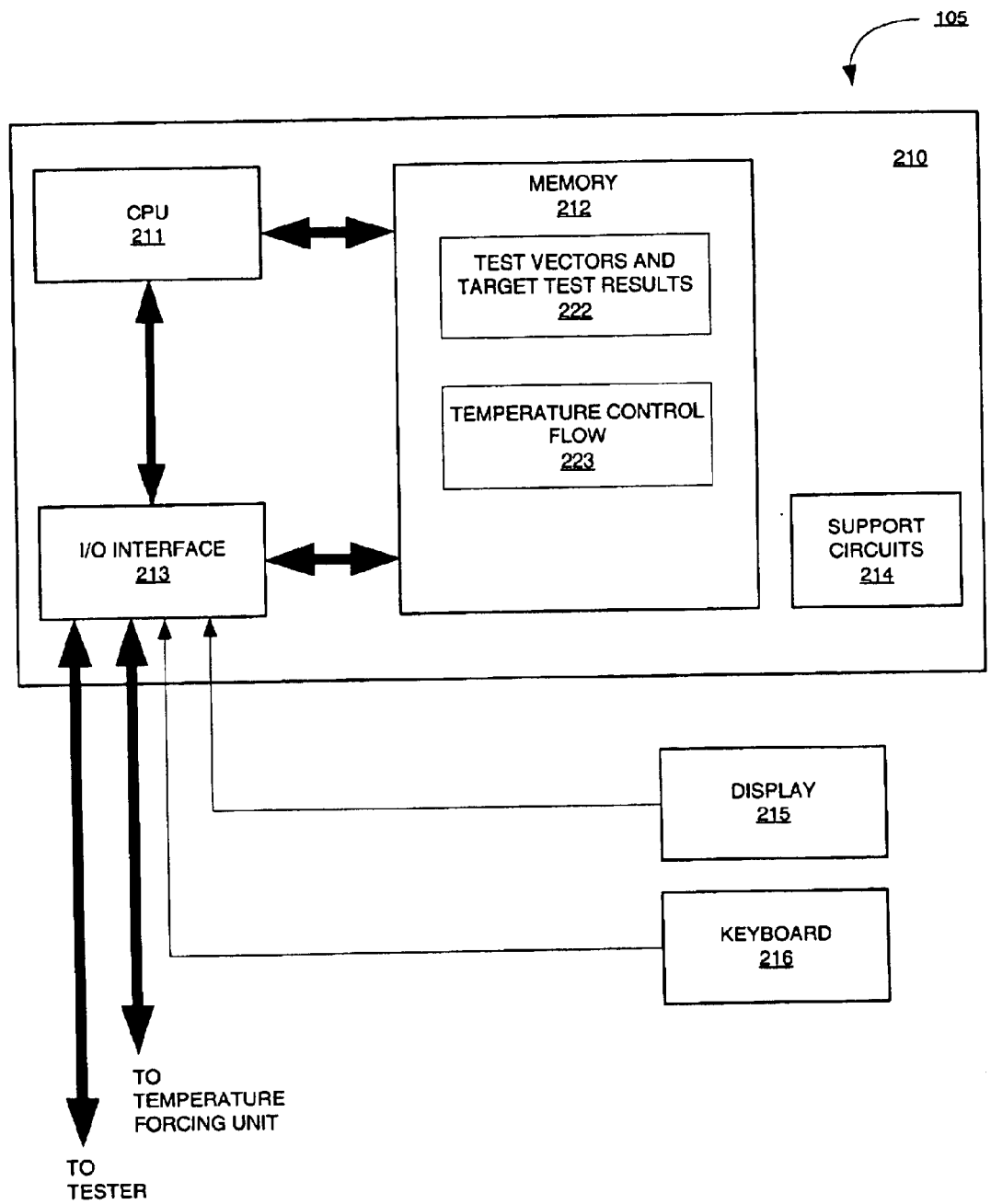
FIG. 2 is a high-level block diagram of an exemplary embodiment of a computer system having a programmed computer.

FIG. 2 is a high-level block diagram of an exemplary embodiment of a computer system 105 having a programmed computer 210. Programmed computer 210 includes a central processing unit (CPU) 211, memory 212, a variety of support circuits 214, and an input/output (I/O) interface 213. CPU 211 may be any type of microprocessor known in the art. Support circuits 214 for CPU 211 may include conventional cache, power supplies, clock circuits, data registers, I/O interfaces, and the like. Memory 212 may be directly coupled to CPU 211 or coupled through I/O interface 213, and I/O interface 213 may be coupled to a conventional keyboard, network, mouse, display printer, and interface circuitry adapted to receive and transmit data, such as data files and the like.

Memory 212 may store all or portions of one or more programs or data to implement processes in accordance with one or more aspects of the invention. Additionally, those skilled in the art will appreciate that one or more aspects of the invention may be implemented in hardware, software, or a combination of hardware and software. Such implementations may include a number of processors independently executing various programs and dedicated hardware, such as application specific integrated circuits (ASICs).

Programmed computer 210 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 212. Memory 212 may include one or more of the following: random access memory, read only memory, magneto-resistive read/write memory, optical read/write memory, cache memory, magnetic read/write memory, and the like, as well as signal-bearing media as described below. One or more aspects of the invention may be implemented as program products for use with computer 210. Program(s) of the program product defines functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of one or more aspects of the invention, represent embodiments of the invention.

Memory 212 may store all or a portion of test vectors and target test results 222. Stored in memory 212 is temperature control flow 223.

Figure 3:
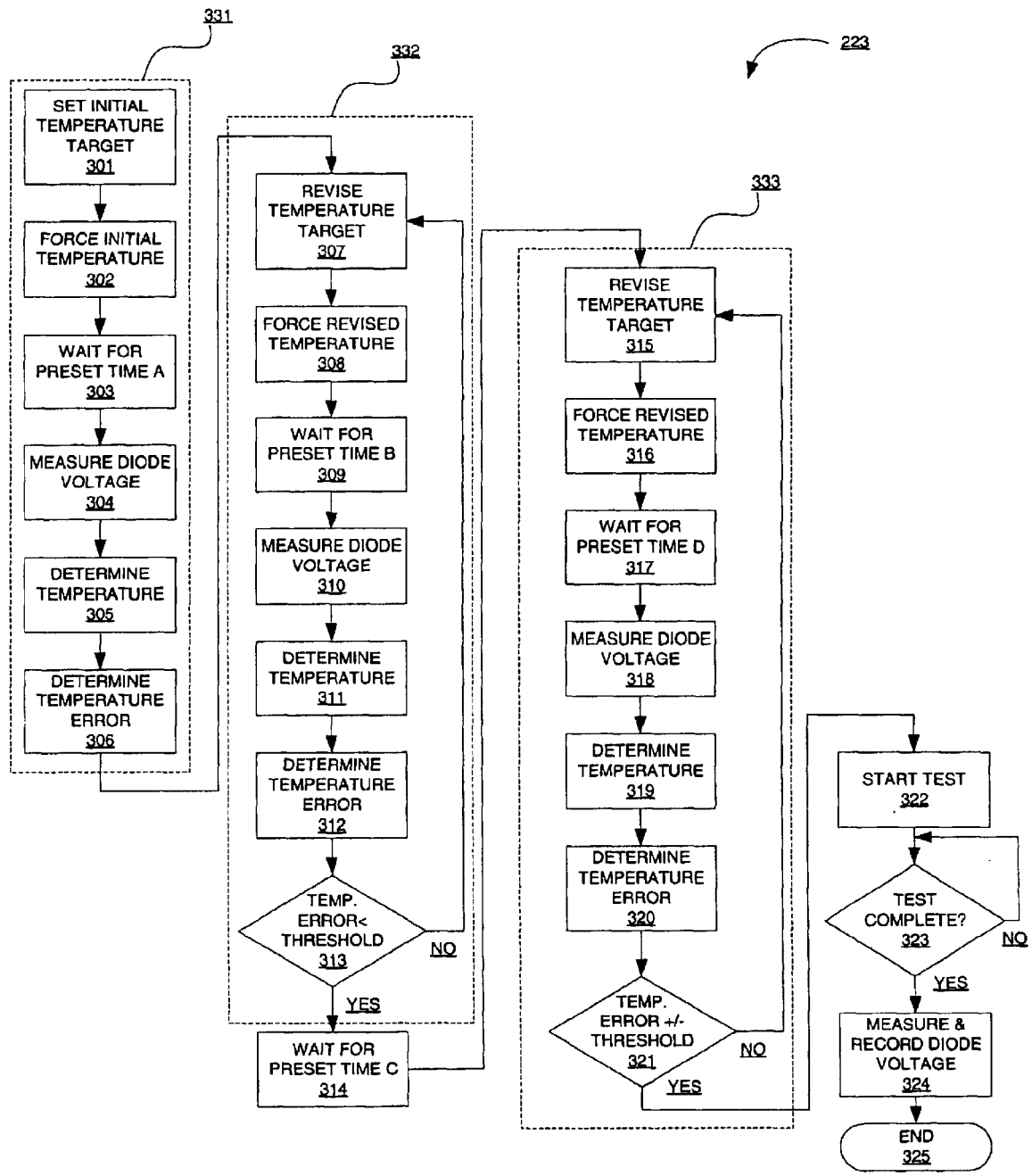
FIG. 3 is a flow diagram depicting an exemplary embodiment of a temperature control flow.
Figure 4:
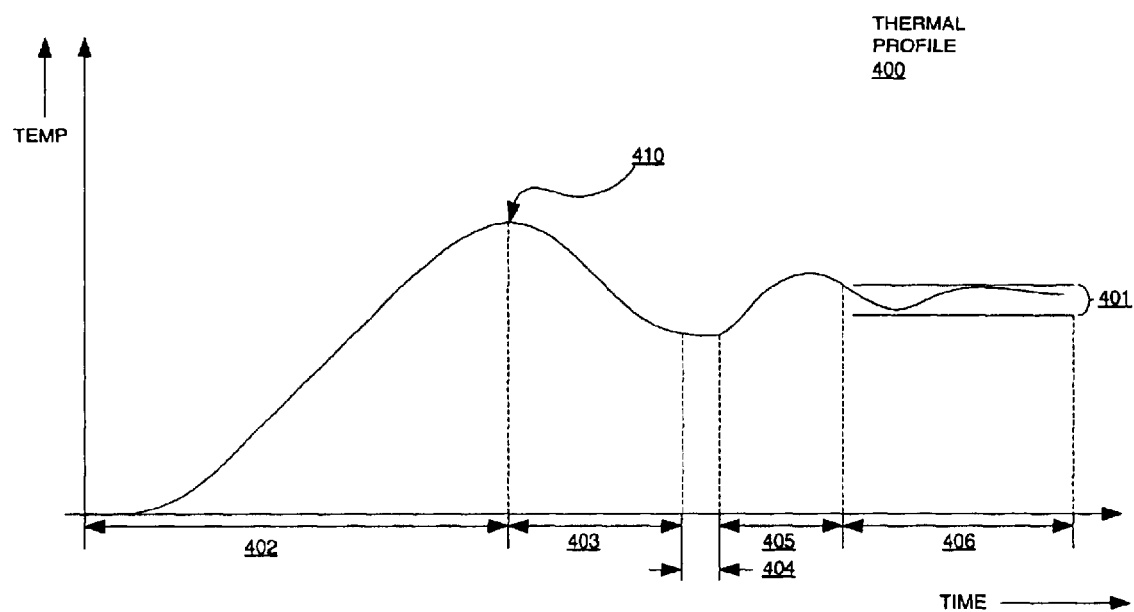
FIG. 4 is a time versus temperature graph depicting an exemplary embodiment of a thermal profile for the temperature control flow of FIG. 3.

FIG. 3 is a flow diagram depicting an exemplary embodiment of a temperature control flow 223, and FIG. 4 is a time versus temperature graph depicting an exemplary embodiment of a thermal profile 400 (not drawn to scale) for temperature control flow 223. Note that while FIG. 4 shows a thermal profile where the temperature of a device being tested is increased, the present invention is equally applicable to decreasing temperatures. Temperature control flow 223 is described with simultaneous reference to FIGS. 1, 2, 3 and 4.

At 301, an initial temperature target is set. At 302, air is flowed from temperature forcing unit 101 over microchip 104. This flowing of air is in response to a control signal from computer 210 to temperature forcing unit 101 in response to temperature control flow 223. This air flow is temperature controlled to force microchip 104 to reach the initial temperature target.

At 303, temperature control flow 223 waits for a preset time A. Preset time A is an initial stabilization interval 402, and will depend on temperature target, starting temperature of microchip 104 and size of microchip 104, among other variables. For example, such an initial stabilization time may be approximately 240 seconds. Initial stabilization should be sufficiently long in duration so as to accelerate reaching the target temperature set at 301 without significantly exceeding such target temperature. The force temperature used at 302 conventionally will exceed the target temperature of 301, and thus an approximation for initial stabilization time interval 402 is a sufficient time for microchip 104 to reach the force temperature of 302.

Figure 5:
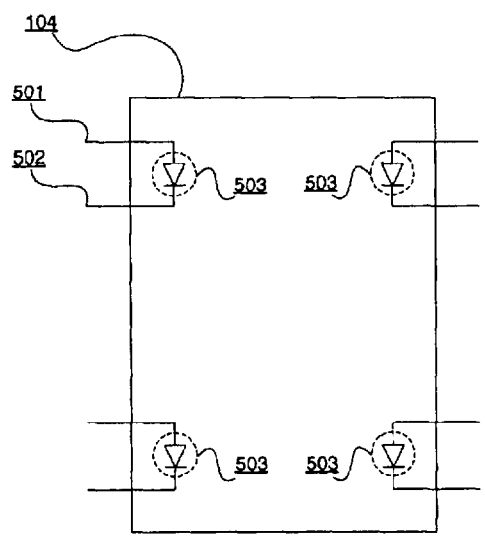
FIG. 5 is a schematic/block diagram depicting an exemplary embodiment of a microchip.

At 304, diode voltage is measured. FIG. 5 is a schematic/block diagram depicting an exemplary embodiment of microchip 104. Microchip 104 includes at least one diode 503 electrically accessible via an input pin 501 and an output pin 502. Diode 503 may be formed with formation of the integrated circuit of microchip 104.

A known level of current is provided to input pin 501 of microchip 104 from tester 102 via data interface bus 103. Tester 102 is configured to provide such a fixed current responsive to a control signal from computer 210 under control of temperature control flow 223.

Voltage, V(T), across diode 503 is dependent in part on junction temperature, T. For voltage, V(T), in volts and temperature, T, in degrees Celsius, the equation for temperature T may be expressed as:

$$T = (A = V(T))/B, \quad (1)$$

where A and B are constants. Constants A and B are empirically determined, as is known. For example, A may be approximately 0.74325 volts, and B may be 0.0018227 volts per degree Celsius. These are merely example values for A and B, and many other values for A and B may be empirically determined as is known. Conventionally, A equals voltage V(T) when temperature T is equal to approximately zero (0) degrees Celsius and current is set to some fixed level. Thus, for example, current may be set to approximately 100 micro-Amperes for determining A. Accordingly, the known level of current supplied to microchip 104 from tester 102 is approximately the same level of current for determining A. Voltage, V(T), which is a function of temperature, T, is a measurable value. Accordingly, by measuring voltage V(T) with known values for A and B, temperature, T, may be determined. In an embodiment, V(T) is a measured voltage from output pin 502 obtained responsive to supplying a known level of current, and thus voltage V(T) provides an indication of junction temperature of diode 503.

After measuring diode voltage at 304, junction temperature is determined at 305 using Equation (1). At 306, temperature error is determined by subtracting temperature determined at 305 from the target temperature of 301. Notably, though temperature error in this example will be a negative number for measured temperature 410, where target temperature is within tolerance band 401, it is possible to have measured temperature immediately after stabilization interval 402 to be below a target temperature. However, for purposes of clarity, the embodiment according to FIG. 4 is described, though other thermal profiles may be used. Thus, initial stabilization sub-flow 331 is completed.

At 307, the temperature target is revised by adding temperature error of 306 to temperature target of 301. As, in this example, temperature error of 306 is a negative number, the revised temperature target will be lower than the initial temperature target.

At 308, thermal forcing unit 101 is instructed by computer 210 under control of temperature control flow 223 to force to the revised target temperature of 307. At 309, temperature control flow 223 waits for a preset time B. Preset time B is a coarse adjustment interval. For example, such a coarse adjustment interval time may be approximately 60 seconds. Coarse adjustment interval should be sufficiently long to avoid an excessive number of coarse adjustments prior to reaching a temperature error threshold. Furthermore, if not enough time is allowed for temperature stabilization, it is equivalent to having no feedback at all, and the temperature may increase without bound for hot temperature testing (or decrease without bound for cold temperature testing). This may result in damage to the device being tested and/or the test equipment being used to apply the test conditions, whereas waiting longer does no harm.

At 310, diode voltage is measured, as previously described with respect to block 304. At 311, temperature is determined, as previously described with respect to block 305. At 312, temperature error is determined by subtracting the revised target temperature of 307 from the determined temperature of 311.

At 313, it is determined whether the temperature error is within plus or minus a percentage of the revised target temperature. This percentage, for example, may be approximately ten percent (10%). If temperature error is outside of tolerance at 313, then temperature error of 312 is added to the revised target temperature of 307 to provide a newly revised target temperature. Accordingly, there may be one or more coarse adjustments for coarse adjustment sub-flow 332, and thus one or more coarse adjustment B intervals which in totality define coarse adjustment interval 403.

If, however, at 313 it is determined that temperature error is within tolerance, then at 314 temperature control flow 223 waits for a preset time C. Preset time C is a coarse stabilization interval. For example, such a coarse stabilization interval time may be approximately 300 seconds. Notably, during coarse stabilization interval 404, temperature of microchip 104 may go out of an acceptable error range, and thus a fine adjustment sub-flow 333 is used.

At 315, the target temperature is revised. This may be done by using the last target temperature from 307 and adding to it the last temperature error determined at 312.

At 316, thermal forcing unit 101 is instructed by computer 210 under control of temperature control flow 223 to force to the revised target temperature of 315. At 317, temperature control flow 223 waits for a preset time D. Preset time D is a fine adjustment interval. For example, such a fine adjustment interval time may be approximately 30 seconds. Fine adjustment interval 405 should be sufficiently long at to avoid an excessive number of fine adjustments prior to reaching a temperature within tolerance band 401.

At 318, diode voltage is measured, as previously described with respect to block 304. At 319, temperature is determined, as previously described with respect to block 305. At 320, temperature error is determined by subtracting the revised target temperature of 315 from the determined temperature of 319.

At 321, it is determined whether the temperature error determined at 320 is within a threshold tolerance, such as stability band 401. If temperature error of 320 is not within tolerance, then fine adjustment sub-flow 333 repeats at 315 using the then temperature error of 320 to update a revised target temperature from an immediately previous iteration temperature target revision 315. If, however, temperature error determined at 320 is within tolerance, namely, sufficient thermal stability is obtained, testing of microchip 104 is initiated at 322.

At 323, it is determined if testing is completed. If testing has not been completed, temperature control flow 223 loops back to 323. If, however, it is determined that testing is completed, then at 324, diode voltage is measured, as previously described with respect to block 304, and at 324 the measured diode voltage is recorded. At 325, temperature control flow 223 ends.

It should be appreciated that interval times are adjusted responsive to temperature error to proceed from a coarse adjustment loop to a fine adjustment loop. To accelerate the coarse loop adjustment, a thermal initialization interval is used. Additionally, a coarse stabilization interval may be used between the coarse and fine adjustment loop to ensure thermal stability prior to refined adjustments toward reaching a stabilization band. It should be appreciated that a thermocouple device connected to microchip packaging need not be used. In other words, thermal conditioning may be done without such a thermocouple device.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A test system for testing a microchip, the microchip having a diode electrically accessible via an input pin and an output pin of the microchip, comprising:

a tester;

a temperature forcing unit;

a programmed computer;

the programmed computer coupled to the tester and the temperature forcing unit;

the programmed computer programmed with a temperature control program, the temperature control program configured to:

obtain a temperature target;

cause the temperature forcing unit to thermally adjust temperature of the, microchip toward the temperature target;

wait for a first interval of time;

measure diode output voltage after the first interval of time; and determine junction temperature proximal to the diode from the diode output voltage measured.

2. The test system, according to claim 1, wherein the tester is configured to provide a fixed current directed to the input pin for generation of the diode output voltage.

3. The test system, according to claim 2, wherein the temperature control program is configured to prompt the test system to provide the fixed current to the input pin.

4. The test system, according to claim 1, wherein the temperature control program is configured to determine a temperature error.

5. The test system, according to claim 4, wherein the temperature error is determined by subtracting the junction temperature determined from the temperature target.

6. The test system, according to claim 5, wherein the junction temperature is equal to:

$$(A=V(T))/B,$$

where A and B are constants and V(T) is the diode output voltage measured.

7. The test system, according to claim 4, wherein the temperature control program is configured to provide a revised temperature target.

8. The test system, according to claim 7, wherein the revised temperature target is the temperature target plus the temperature error.

9. The test system, according to claim 7, wherein the temperature control program is configured to:

(a) obtain the revised temperature target;

(b) cause the temperature forcing unit to thermally adjust temperature of the microchip toward the revised temperature target;

(c) wait for a second interval of time;

(d) measure diode output voltage after the second interval of time; and (e) determine the junction temperature anew from the diode output voltage measured after the second interval of time.

10. The test system, according to claim 9, wherein the temperature control program is configured to determine the temperature error anew from the diode output voltage measured after the second interval of time and the revised temperature target, to provide the revised temperature target anew by adding the temperature error anew to the revised temperature target, and to repeat (a) through (e) until the temperature error anew is within a first threshold range.

11. The test system, according to claim 10, wherein the temperature control program is configured to wait for a third interval of time.

12. The test system, according to claim 11, wherein the temperature control program is configured to repeat (a) through (e) using a fourth interval of time in place of the second interval of time.

13. The test system, according to claim 12, wherein the temperature control program is configured to determine the temperature error anew from the diode output voltage measured after the fourth interval of time, and to repeat (a) though (e) using the fourth interval of time until the temperature error anew is within a second threshold range.

14. The test system, according to claim 13, wherein the second threshold range is smaller than the first threshold range.

15. A signal-bearing medium containing a program which, when executed by a processor in response to receiving thermal profile input, causes execution of a method comprising:

obtaining an initial temperature target;

causing a temperature forcing unit to thermally adjust temperature of a microchip toward the initial temperature target, the microchip having a diode;

waiting for a first interval of time;

measuring diode output voltage of the diode after the first interval of time; and determining junction temperature proximal to the diode from the diode output voltage measured.

16. The signal-bearing medium, according to claim 15, wherein the method further comprises:

determining a temperature error; and producing a revised temperature target by combining the temperature error and the initial temperature target.

17. The signal-bearing medium, according to claim 16, wherein the method further comprises:

(a) obtaining the revised temperature target;

(b) causing the temperature forcing unit to thermally adjust temperature of the microchip toward the revised temperature target;

(c) waiting for a second interval of time;

(d) measuring diode output voltage after the second interval of time; and (e) determining the junction temperature anew from the diode output voltage measured after the second interval of time.

18. The signal-bearing medium, according to claim 17, wherein the method further comprises:

determining the temperature error anew from the diode output voltage measured after the second interval of time and the revised temperature target;

producing the revised temperature target anew by adding the temperature error anew to the revised temperature target; and repeating the steps (a) through (e) until the temperature error anew is within a first threshold range.

19. The signal-bearing medium, according to claim 18, wherein the method further comprises waiting for a third interval of time.

20. The signal-bearing medium, according to claim 19, wherein the method further comprises repeating the steps (a) through (e) using a fourth interval of time in place of the second interval of time.

21. The signal-bearing medium, according to claim 20, wherein the method further comprises:

determining the temperature error anew from the diode output voltage measured after the fourth interval of time; and repeating the steps (a) though (e) using the fourth interval of time until the temperature error anew is within a second threshold range.

22. The signal-bearing medium, according to claim 21, wherein the first interval of time is an initial stabilization interval, wherein at least one of the second interval of time is a coarse adjustment interval, wherein the third interval of time is a coarse stabilization interval, and wherein at least one of the fourth interval of time is a fine adjustment interval.

23. The signal-bearing medium, according to claim 21, wherein the first threshold range is a coarse adjustment threshold range, and wherein the second threshold range is a stability band.

24. A method for thermally conditioning a microchip, the method comprising:

setting an initial temperature target;

thermally conditioning the microchip responsive to the initial temperature target over an initial stabilization interval;

measuring a first diode voltage of a diode of the microchip;

determining a first diode temperature responsive to the first diode voltage measured;

comparing the first diode temperature with the initial temperature target to determine a first temperature error;

(a) generating a coarse temperature target responsive to the first temperature error and the initial temperature target;

(b) thermally conditioning the microchip responsive to the coarse temperature target over a coarse adjustment interval;

(c) measuring a second diode voltage of the diode of the microchip after the coarse adjustment interval;

(d) determining a second diode temperature responsive to the second diode voltage measured;

(e) comparing the second diode temperature with the coarse temperature target to determine a second temperature error;

thermally conditioning the microchip over a coarse stabilization interval;

(f) generating a fine temperature target responsive to the second temperature error and the coarse temperature target;

(g) thermally conditioning the microchip responsive to the fine temperature target over a fine adjustment interval;

(h) measuring a third diode voltage of the diode of the microchip after the fine adjustment interval;

(i) determining a third diode temperature responsive to the third diode voltage measured; and (j) comparing the third diode temperature with the fine temperature target to determine a third temperature error.

25. The method, according to claim 24, wherein the coarse temperature target, the second diode voltage, the second diode temperature and the second temperature error are generated from one or more iterations of the steps (a) through (e).

26. The method, according to claim 25, wherein the fine temperature target, the third diode voltage, the third diode temperature and the third temperature error are generated from one or more iterations of the steps (f) through (j).

* * * * *